US012046530B2

(12) United States Patent
Lan et al.

(10) Patent No.: US 12,046,530 B2
(45) Date of Patent: Jul. 23, 2024

(54) THERMAL BRIDGE INTERPOSER STRUCTURE

(71) Applicant: QUALCOMM Incorporated, San Diego, CA (US)

(72) Inventors: Je-Hsiung Lan, San Diego, CA (US); Jonghae Kim, San Diego, CA (US); Ranadeep Dutta, Del Mar, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 225 days.

(21) Appl. No.: 17/558,508

(22) Filed: Dec. 21, 2021

(65) Prior Publication Data

US 2023/0197554 A1 Jun. 22, 2023

(51) Int. Cl.
*H01L 21/48* (2006.01)
*H01L 23/367* (2006.01)
*H01L 25/00* (2006.01)
*H01L 25/065* (2023.01)

(52) U.S. Cl.
CPC ...... *H01L 23/3677* (2013.01); *H01L 21/4871* (2013.01); *H01L 25/0655* (2013.01); *H01L 25/50* (2013.01)

(58) Field of Classification Search
CPC .................................................. H01L 23/3677
See application file for complete search history.

(56) References Cited

U.S. PATENT DOCUMENTS

| 6,265,772 | B1 | 7/2001 | Yoshida |
| 6,611,055 | B1 | 8/2003 | Hashemi |
| 11,869,842 | B2 * | 1/2024 | Ganesan ............. H01L 23/5381 |
| 2021/0272885 | A1 * | 9/2021 | Arrington ............. H01L 25/105 |
| 2021/0305162 | A1 | 9/2021 | Ganesan et al. |
| 2023/0064277 | A1 * | 3/2023 | Lai ........................ H01L 21/563 |
| 2023/0148220 | A1 * | 5/2023 | Verhaverbeke ..... H01L 23/5389 257/690 |
| 2023/0282615 | A1 * | 9/2023 | Wagner ............... H01L 23/3128 257/686 |
| 2024/0063087 | A1 * | 2/2024 | Kuo ..................... H01L 23/5383 |
| 2024/0071933 | A1 * | 2/2024 | Marin ................. H01L 23/5383 |

FOREIGN PATENT DOCUMENTS

JP 2010153667 A 7/2010

OTHER PUBLICATIONS

International Search Report and Written Opinion—PCT/US2022/080643—ISA/EPO—May 9, 2023.

* cited by examiner

*Primary Examiner* — Thao P Le
(74) *Attorney, Agent, or Firm* — Muncy, Geissler, Olds & Lowe, P.C.

(57) ABSTRACT

Disclosed are apparatuses and techniques for fabricating an apparatus including a semiconductor device. The semiconductor device may include: a die, a thermally conductive interface that includes a thermal bridge interposer (THBI) structure, and a substrate. The die is coupled to the substrate by the thermally conductive interface and at least a portion of the die is coupled to the substrate by the THBI structure.

28 Claims, 11 Drawing Sheets

THERMAL BRIDGE INTERPOSER STRUCTURE

BACKGROUND OF THE DISCLOSURE

1. Field of the Disclosure

Aspects of the disclosure relate generally to apparatuses including electronic devices incorporating semiconductor devices, and more specifically, but not exclusively, to interposers and bridges and fabrication techniques thereof.

2. Description of the Related Art

Wireless communication systems have developed through various generations, including a first-generation analog wireless phone service (1G), a second-generation (2G) digital wireless phone service (including interim 2.5G and 2.75G networks), a third generation (3G) high speed data, Internet-capable wireless service and a fourth generation (4G) service (e.g., Long Term Evolution (LTE) or WiMax). There are presently many different types of wireless communication systems in use, including cellular and personal communications service (PCS) systems. Examples of known cellular systems include the cellular analog advanced mobile phone system (AMPS), and digital cellular systems based on code division multiple access (CDMA), frequency division multiple access (FDMA), time division multiple access (TDMA), the Global System for Mobile communications (GSM), etc.

A fifth generation (5G) wireless standard, referred to as New Radio (NR), enables higher data transfer speeds, greater numbers of connections, and better coverage, among other improvements. The 5G standard, according to the Next Generation Mobile Networks Alliance, is designed to provide higher data rates as compared to previous standards, more accurate positioning, and other technical enhancements.

Integrated circuit technology has achieved great strides in advancing computing power through miniaturization of components and has enabled the practical implementation and commercialization of the aforementioned wireless communication systems and components thereof. The various integrated circuit and packaging technologies (e.g., including interposers/bridges) can be found in many electronic devices, including processors, servers, radio frequency (RF) integrated circuits, etc. Advanced packaging technology becomes cost-effective in high pin count devices. Advanced packaging and processing techniques allow for system on a chip (SOC) devices, which may include multiple function blocks, with each function block designed to perform a specific function, such as, for example, a microprocessor function, a graphics processing unit (GPU) function, a communications function (e.g., cellular, Wi-Fi, Bluetooth, and other communications), and the like.

Accordingly, there is a need for systems, apparatuses and methods that overcome the deficiencies of conventional integrated circuit and packaging technologies having interposers and/or bridges including the methods, systems and apparatuses provided herein in the following disclosure.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In accordance with the various aspects disclosed herein, at least one aspect includes, an apparatus including a semiconductor device, where the semiconductor device includes a die; a thermally conductive interface including a thermal bridge interposer (THBI) structure; and a substrate. The die is coupled to the substrate by the thermally conductive interface and at least a portion of the die is coupled to the substrate by the THBI structure.

In accordance with the various aspects disclosed herein, at least one aspect includes a method for fabricating a semiconductor device, the method includes: providing a die; forming a thermally conductive interface may include forming a thermal bridge interposer (THBI) structure; and coupling the thermally conductive interface to the die and to a substrate, where at least a portion of the die is coupled to the substrate by the THBI structure.

Other objects, features and advantages associated with the apparatus and methods disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and a more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
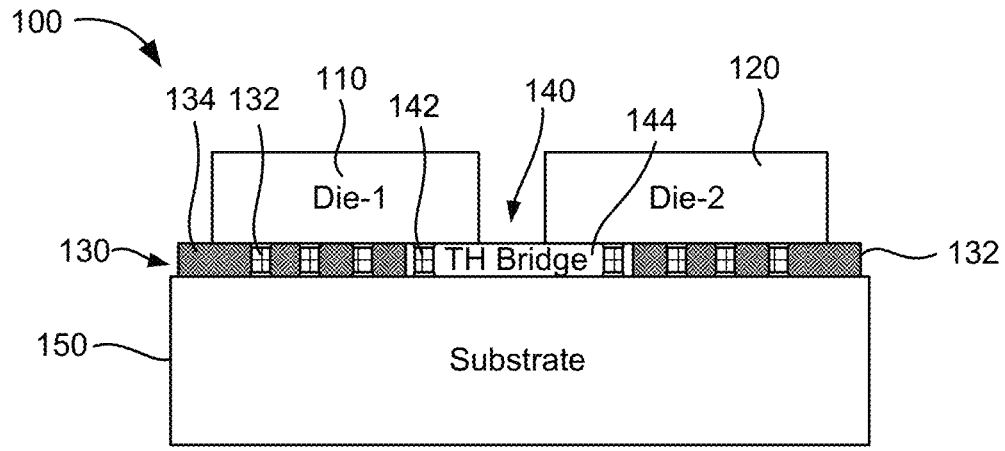
FIG. 1 illustrates a semiconductor device in accordance with one or more aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Disclosed aspects of the present disclosure are illustrated in the following description and related drawings directed to specific aspects of the disclosure. Alternate aspects be devised without departing from the scope of the teachings herein. Additionally, well-known elements of the illustrative aspects herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

For SOC chipsets used in high-speed computing and/or high-power application, thermal overload is a significant concern and can result in degrading the overall systems performance. For example, efficiency may be reduced for an radio frequency (RF) Power Amplifier transmitting in a high-power mode. For RF and high speed SOC chipsets, high thermal conductivity and low insertion loss are desirable characteristics.

Commonly used mitigation techniques include a reduction of the thermal resistance by enhancing the thermal path through Copper (Cu) Bumps and increasing the remaining/back-grinded silicon thickness of the chipset. However, the increased thickness of the chipset is not desirable for the product form factor (e.g., Z height).

In conventional fabrication and assembly processes, bridge devices are filled with electronic molding compound (EMC) material that is used between chiplets under a high-performance chip, such as an RF Power Amplifier or application processor (AP) chip to substrate. EMC has low thermal conductivity (~1-2 W/m-K), which does not contribute to thermal conduction through the primary path (e.g., Cu pillar bumps). Some designs use embedded silicon-based bridge devices which are embedded in a printed circuit board (PCB) substrate. Although embedded silicon-based bridge devices have good thermal conductivity, the high loss tangent is not desirable for high-speed SOCs and especially RF chipsets that can introduce significant insertion loss.

In accordance with the various aspects disclosed, a thermal bridge interposer (THBI) structure provides enhanced thermal conductance of SOC chipsets and reduces bridge induced insertion loss for RF chipsets. It will be appreciated the term thermal bridge interposer is used to indicate the THBI structure may be used as a bridge and/or an interposer. The THBI structure offers a parallel thermal path to the existing Cu pillar bumps. The THBI structure is inserted in the area of local hot spots of a given chiplet and/or between chipsets, with through-holes, for Cu pillar bumps to pass through. The thermal bridge, in some aspects, may formed from materials with a high thermal conductivity, such as, Alumina ceramic, which has a thermal conductivity (K) on a range of 30-40 watts per meter Kelvin (W/mK) and a thickness of 40-80 um. Through-holes in the alumina ceramic, in some aspects, may be formed by laser ablation. Further, the THBI structure, in some aspects, has a low insertion loss due to very low loss tangent (e.g., 0.0001).

FIG. 1 illustrates a semiconductor device 100 according to at least one aspect of the disclosure. The semiconductor device 100 includes a die 110, a thermally conductive interface 130 including a thermal bridge interposer (THBI) structure 140 and a substrate 150. The die 110 is coupled to the substrate 150 by the thermally conductive interface 130 and at least a portion of the die 110 is coupled to the substrate 150 by the THBI structure 140. The thermally conductive interface 130 further includes a plurality of conductive pillars 132 embedded in a mold compound 134. In some aspects, the plurality of conductive pillars 132 and the plurality of conductive through-vias 142 are coplanar on a first side of the thermally conductive interface 130 adjacent the substrate 150. In some aspects, the plurality of conductive pillars 132 extend beyond the plurality of conductive through-vias 142 on a second side of the thermally conductive interface 130 adjacent the die 110. In some aspects, a portion of the plurality of conductive through-vias 142 extend past the ceramic layer 144 on the first side of the thermally conductive interface 130. In some aspects, the portion of the plurality of conductive through-vias 142 is embedded in the mold compound 134.

In some aspects, the semiconductor device 100 includes a second die 120. The second die 120 is coupled to the die 110 by the THBI structure 140, which functions as a bridge between the die 110 and the second die 120. The second die 120 is also coupled to the substrate 150 by the thermally conductive interface 130 and at least a portion of the second die 120 is coupled to the substrate by the THBI structure 140.

Figure 2:
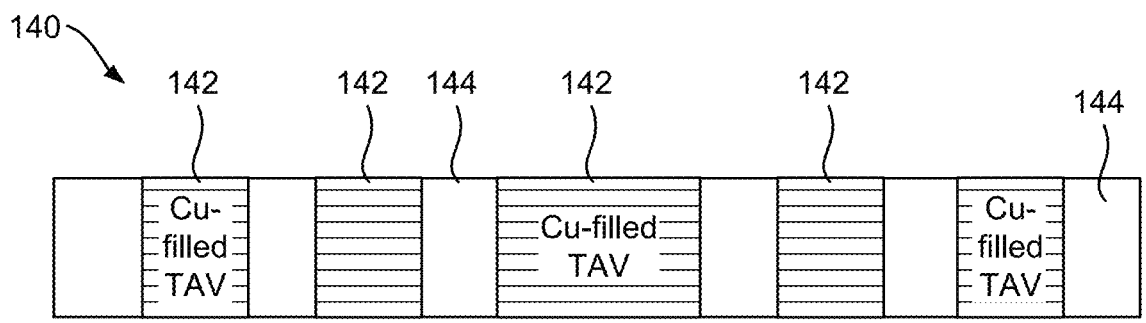
FIG. 2 illustrates a cross-sectional view and perspective view of a thermal bridge interposer (THBI) structure in accordance with one or more aspects of the disclosure.
Figure 2:
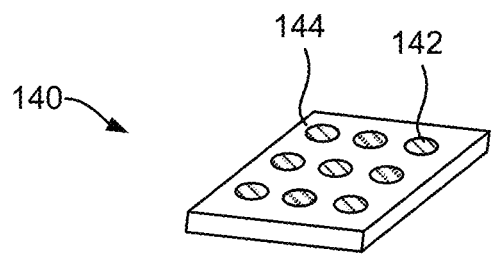

FIG. 2 illustrates the thermal bridge interposer (THBI) structure 140 according to at least one aspect of the disclosure. The THBI structure 140 is illustrated in a cross-sectional view and perspective view. The THBI structure 140 comprises a ceramic layer 144 and a plurality of conductive through-vias 142 disposed through the ceramic layer 144. In some aspects, the plurality of conductive through-vias 142 comprise Copper (Cu). In some aspects, the ceramic layer 144 may be formed of an Alumina ceramic or any other suitable material with a thermal conductivity on a range of 30-40 watts per meter Kelvin (W/mK). In some aspects, the plurality of conductive through-vias is through Alumina vias (TAVs).

Figure 3:
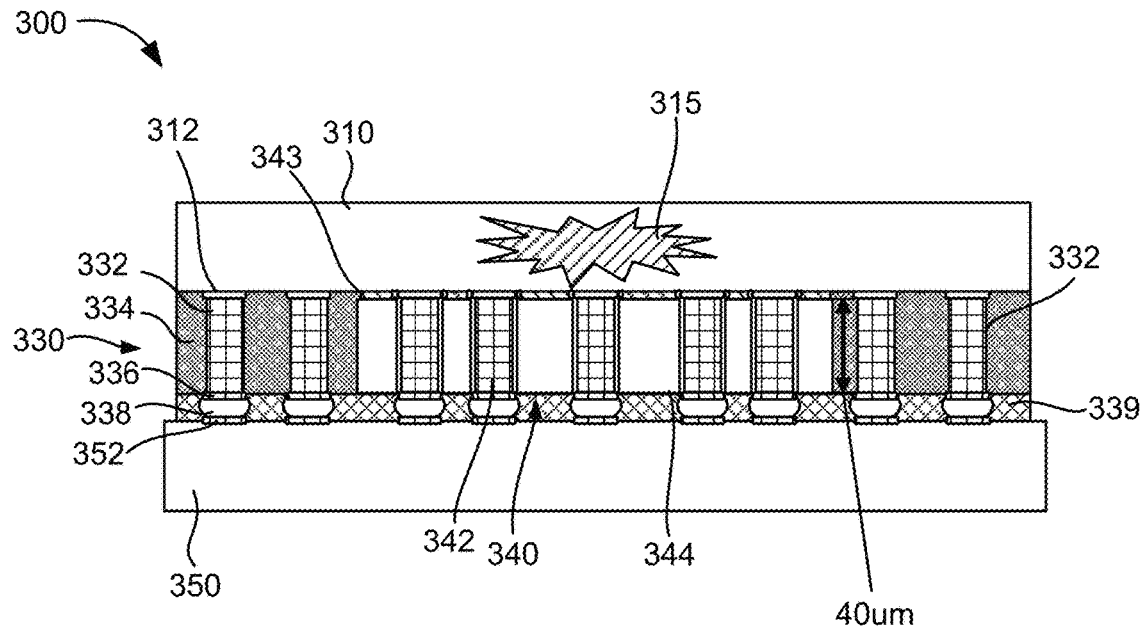
FIG. 3 illustrates a semiconductor device in accordance with one or more aspects of the disclosure.

FIG. 3 illustrates a semiconductor device 300 according to at least one aspect of the disclosure. The semiconductor device 300 includes a die 310, a thermally conductive interface 330 including a thermal bridge interposer (THBI) structure 340 and a substrate 350. The die 310 is coupled to the substrate 350 by the thermally conductive interface 330 and at least a portion of the die 310 is coupled to the substrate 350 by the THBI structure 340. The THBI structure 340 may be located adjacent a hotspot 315. The hotspot 315 may be a portion of the die 310 having a high-performance processor, power amplifier, etc. that generates a significant thermal load. The thermally conductive interface 330 further includes a plurality of conductive pillars 332 embedded in a mold compound 334. The conductive pillars 332 may be Copper (Cu) or other highly conductive materials. In some aspects, the plurality of conductive pillars 332 and the plurality of conductive through-vias 342 are coplanar on a first side of the thermally conductive interface 330 adjacent the substrate 350. In some aspects, the plurality of conductive pillars 332 and the plurality of conductive through-vias 342 on a second side of the thermally conductive interface 330 adjacent the die 310 are directly coupled to using pads 312 using hybrid bond. In some aspects a die-to-wafer (D2W) hybrid bonding process may be used. In some aspects a bonding layer 343 (e.g., oxide layer) may be used to thermally couple the THBI structure 340 to the die 310, specifically the ceramic layer 344 to the die 310. In some aspects, the thermally conductive interface 330 further includes a plurality of pads 336 coupled to the plurality of conductive pillars 332 and the plurality of conductive through-vias 342 on the first side (substrate 350 side) and a plurality of solder bumps 338 coupled to the plurality of pads 336. The plurality of pads 336 and the plurality of solder bumps couple the plurality of conductive pillars 332 and the plurality of conductive through-vias 342 to the substrate 350 using substrate pads 352. The plurality of solder bumps 338 and the plurality of pads 336 are embedded in a second mold compound 339, which thermally couples the thermally conductive interface 330 to the substrate 350. The second mold compound 339 in some aspects may be an Epoxy Molding Compound and, in some aspects, can be thermally conductive.

Figure 4:
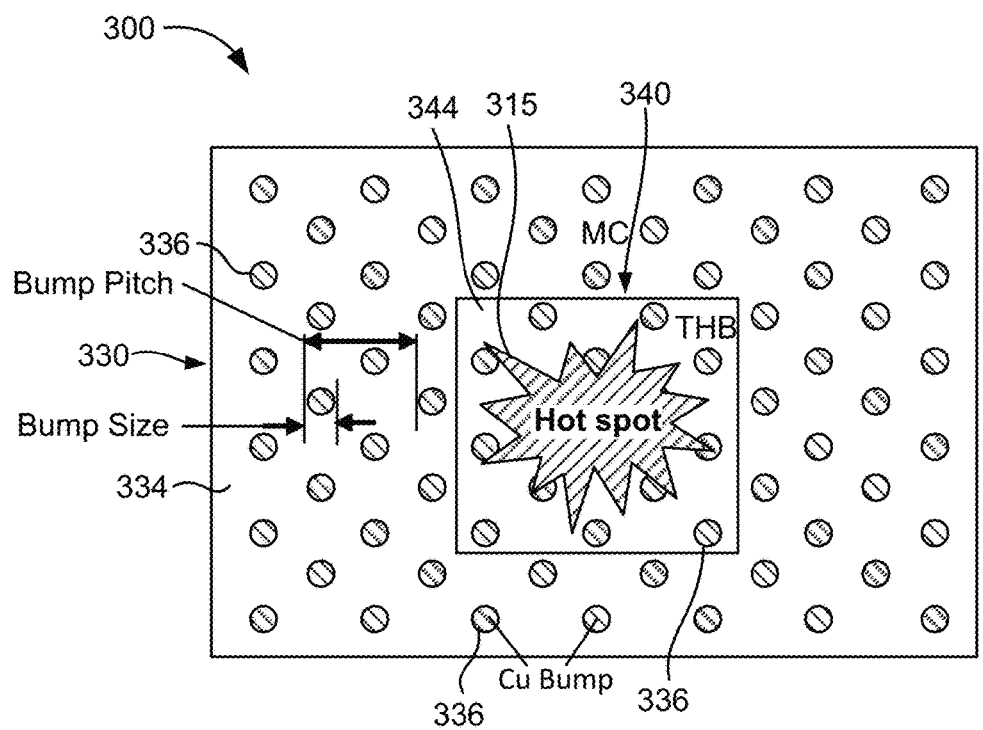
FIG. 4 illustrates a bottom plan view of a thermally conductive interface of a semiconductor device in accordance with one or more aspects of the disclosure.

FIG. 4 illustrates a semiconductor device 300 according to at least one aspect of the disclosure. In the illustrated aspect, a bottom plan view of the thermally conductive interface 330 is provided. The THBI structure 340 occupies a portion of the thermally conductive interface 330 and in some aspects is located adjacent a hotspot 315, as noted above. The thermally conductive interface 330 further includes a plurality of conductive pillars 332 embedded in a mold compound 334. In some aspects, the plurality of pads 336 have a same pitch and a same size that is maintained in both the THBI structure 340 portion and the molded conductive pillar portion of the thermally conductive interface 330.

Figure 5:
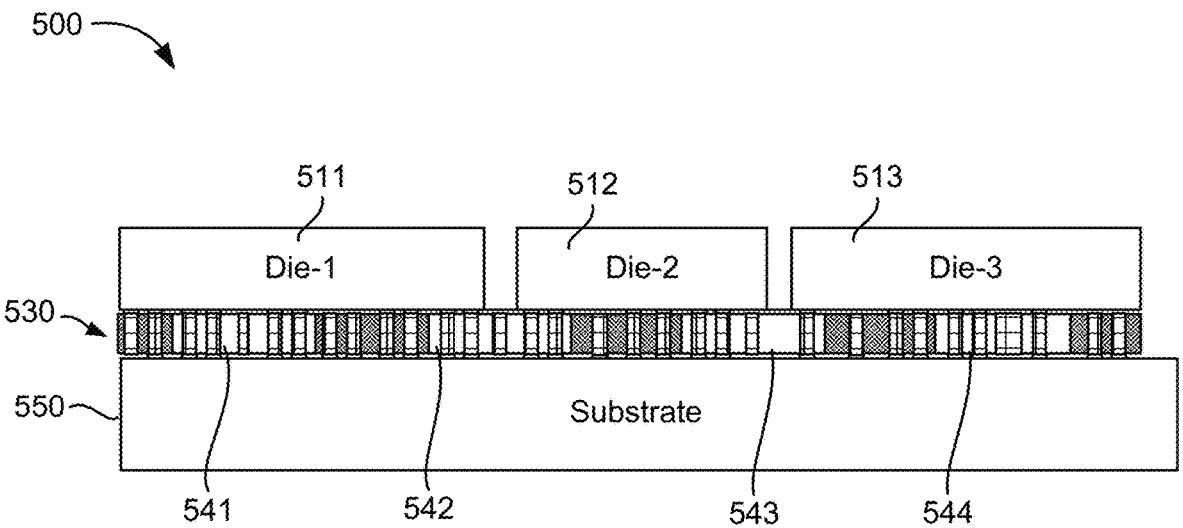
FIG. 5 illustrates a semiconductor device in accordance with one or more aspects of the disclosure.

FIG. 5 illustrates a semiconductor device 500 according to at least one aspect of the disclosure. The semiconductor device 500 includes a plurality of dies including a first die 511, a second die 512, a third die 513, a thermally conductive interface 530 including a first THBI structure 541, a second THBI structure 542, a third THBI structure 543, a fourth THBI structure 544, and a substrate 550. The THBI structures (541, 542, 543 and 544) and thermally conductive interface 530 may be similar to those described in the foregoing sections, so a detailed description will not be provided herein. The thermally conductive interface 530 including the THBI structures (541, 542, 543 and 544) may be used to couple the first die 511, the second die 512, and the third die 513 to the substrate 350. Further, the first THBI structure 541 may be configured in an interposer arrangement and is only coupled to pads within a perimeter of the first die. In accordance with some aspects, the second THBI structure 542 is configured as a bridge to couple the first die 511 to the second die 512. In accordance with some aspects, the third THBI structure 543 is configured as a bridge to couple the third die 513 to the second die 512. In some aspects, the fourth THBI structure 544 may be configured in an interposer arrangement and is only coupled to pads within a perimeter of the first die. It will be appreciated that the foregoing illustration merely provides example configurations of THBI structures in interposer and bridge arrangements. However, the various aspects disclosed are not limited to the illustrated configuration.

Figure 6:
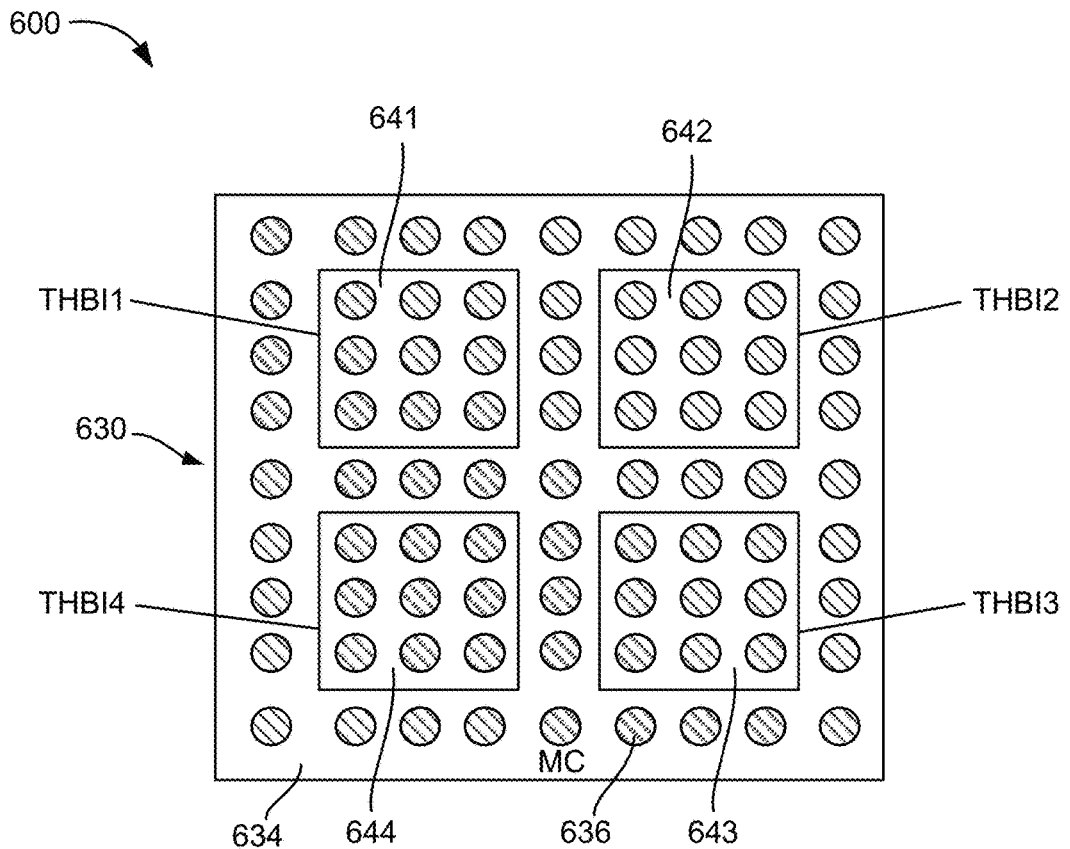
FIG. 6 illustrates a semiconductor device in accordance with one or more aspects of the disclosure.

FIG. 6 illustrates a semiconductor device 600 according to at least one aspect of the disclosure. In the illustrated aspect, a bottom plan view of the thermally conductive interface 630 is provided. The thermally conductive interface 630 includes a first THBI structure 641, a second THBI structure 642, a third THBI structure 643, and a fourth THBI structure 644. THBI structures 641, 642, 643, and 644 occupy portions of the thermally conductive interface 630 and in some aspects are located adjacent hotspots, as noted above. The thermally conductive interface 630 further includes a plurality of pads 636 which may have a same pitch and a same size that is maintained in both the THBI structure portions comprising conductive through-vias (not illustrated) coupled to pads 336 and the molded conductive pillar portion comprising a mold compound 634 and conductive pillars (not illustrated) coupled to pads 336 of the thermally conductive interface 630. However, in other aspects the pad pitch and/or size may vary across the thermally conductive interface 630. In the illustrated configuration the THBI structures 641, 642, 643, and 644 are arranged in a two-by-two grid pattern. It will be appreciated that the various aspects disclosed herein are not limited to this configuration or any specific arrangement or number of THBI structures.

Figure 7:
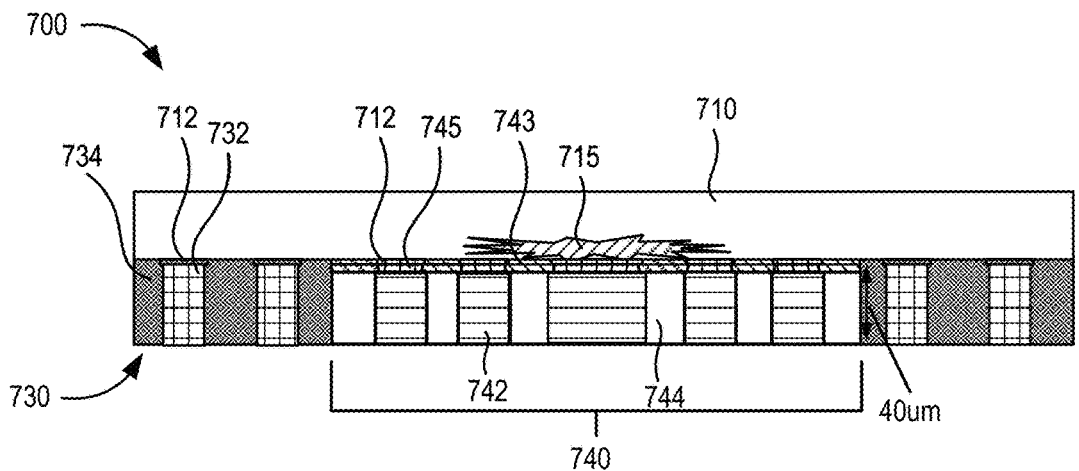
FIG. 7 illustrates a portion of a semiconductor device in accordance with one or more aspects of the disclosure.

FIG. 7 illustrates a portion of a semiconductor device 700 according to at least one aspect of the disclosure. The semiconductor device 700 includes a die 710, and a thermally conductive interface 730 including a thermal bridge interposer (THBI) structure 740. The die 710 is coupled to the thermally conductive interface 730 and at least a portion of the die 710 is coupled to the THBI structure 740. The THBI structure 740 may be located adjacent a hotspot 715. The hotspot 715 may be a portion of the die 710 having a high-performance processor, RF power amplifier, etc. that generates a significant thermal load. The thermally conductive interface 730 further includes a plurality of conductive pillars 732 embedded in a mold compound 734. In some aspects, the plurality of conductive pillars 732 and the plurality of conductive through-vias 742 are coplanar on a first side of the thermally conductive interface 730 opposite the die 710. In some aspects, on a second side of the thermally conductive interface 730 adjacent the die 710, the plurality of conductive through-vias 742 each have a top pad 745 which is directly bonded to the die pads 712. In some aspects a bonding layer 743 (e.g., which may be formed by one or more oxide layers) may be used to thermally couple the THBI structure 740 to the die 710, specifically the bonding layer 743 couples the ceramic layer 744 to the die 710.

Figure 8:
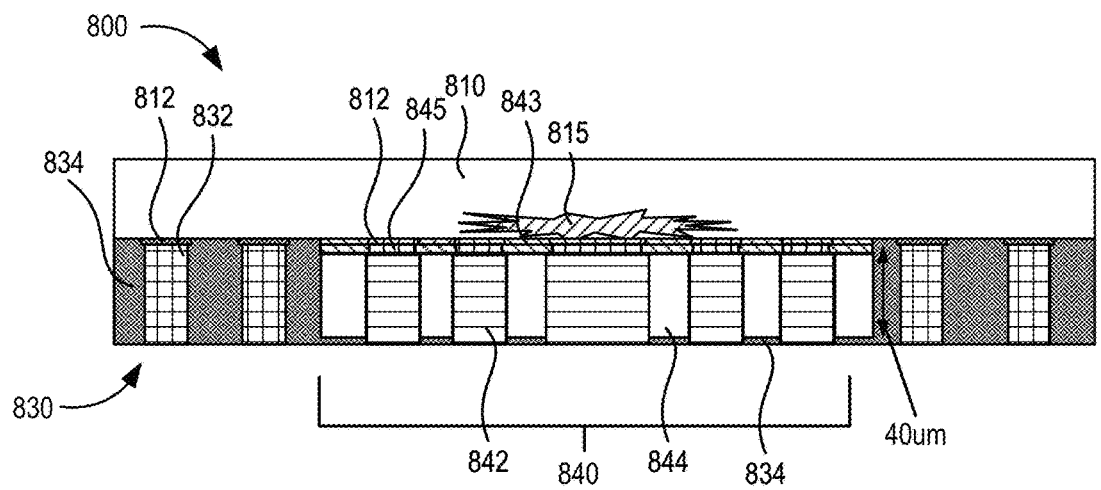
FIG. 8 illustrates a portion of a semiconductor device in accordance with one or more aspects of the disclosure.

FIG. 8 illustrates a portion of a semiconductor device 800 according to at least one aspect of the disclosure. The semiconductor device 800 includes a die 810, and a thermally conductive interface 830 including a thermal bridge interposer (THBI) structure 840. The die 810 is coupled to the thermally conductive interface 830 and at least a portion of the die 810 is coupled to the THBI structure 840. The THBI structure 840 may be located adjacent a hotspot 815. The hotspot 815 may be a portion of the die 810 having a high-performance processor, RF power amplifier, etc. that generates a significant thermal load. The thermally conductive interface 830 further includes a plurality of conductive pillars 832 embedded in a mold compound 834. In some aspects, the plurality of conductive pillars 832 and the plurality of conductive through-vias 842 are coplanar on a first side of the thermally conductive interface 830 opposite the die 810. In some aspects, on a second side of the thermally conductive interface 830 adjacent the die 810, the plurality of conductive through-vias 842 each have a top pad 845 which is directly coupled to the die pads 812. In some aspects a bonding layer 843 (e.g., oxide bonding layer) may be used to form oxide-to-oxide and Cu-to-Cu hybrid bond of the THBI structure 840 to the die 810, specifically the bonding layer 843 for hybrid-bond of the ceramic layer 844 to the die 810. In some aspects, the plurality of conductive pillars 832 extend beyond the plurality of conductive through-vias 842 on the second side of the thermally conductive interface 830 adjacent the die 810. In some aspects, a portion of the plurality of conductive through-vias 842 extend past the ceramic layer 844 on the first side of the thermally conductive interface 830. In some aspects, the portion of the plurality of conductive through-vias 842 extending from the ceramic layer 844 is embedded in the mold compound 834.

Figure 9:
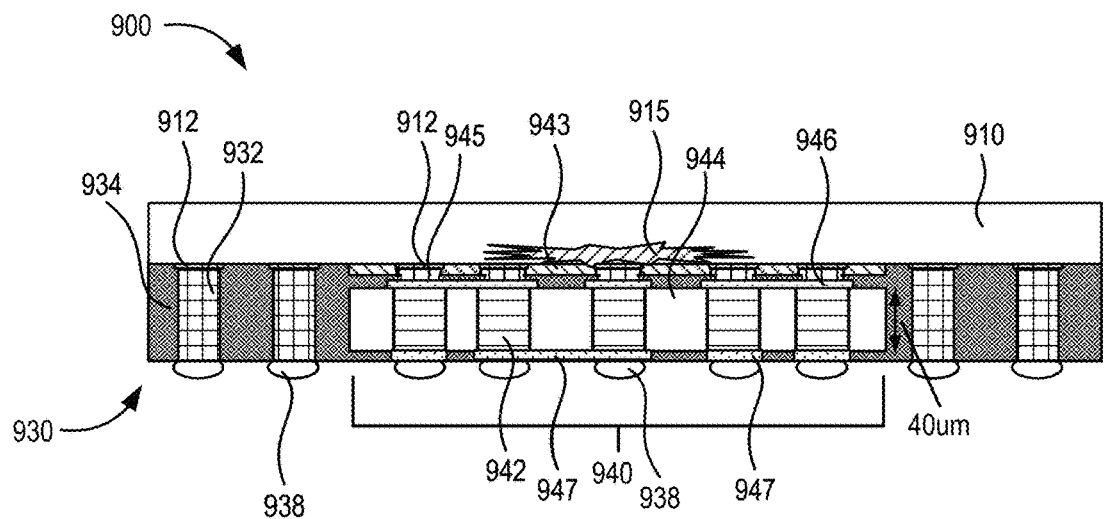
FIG. 9 illustrates a portion of a semiconductor device in accordance with one or more aspects of the disclosure.

FIG. 9 illustrates a portion of a semiconductor device 900 according to at least one aspect of the disclosure. The semiconductor device 900 includes a die 910, and a thermally conductive interface 930 including a thermal bridge interposer (THBI) structure 940. The die 910 is coupled to the thermally conductive interface 930 and at least a portion of the die 910 is coupled to the THBI structure 940. The THBI structure 940 may be located adjacent a hotspot 915. The hotspot 915 may be a portion of the die 910 having a high-performance processor, RF power amplifier, etc. that generates a significant thermal load. The thermally conductive interface 930 further includes a plurality of conductive pillars 932 embedded in a mold compound 934. In some aspects, the plurality of conductive pillars 932 and the plurality of conductive through-vias 942 are coplanar on a first side of the thermally conductive interface 930 opposite the die 910. In some aspects, on a second side of the thermally conductive interface 930 adjacent the die 910, the plurality of conductive through-vias 942 each have a top pad 945 which is directly coupled to the die pads 912. In some aspects a bonding layer 943 (e.g., which may be formed by one or more oxide layers) may be used to thermally couple the THBI structure 940 to the die 910, specifically the bonding layer 943 couples the ceramic layer 944 to the die 910. In some aspects, the plurality of conductive pillars 932 extend beyond the plurality of conductive through-vias 942 on the second side of the thermally conductive interface 930 adjacent the die 910. In some aspects, as in the illustrated configuration, the plurality of conductive pillars 932 and the plurality of conductive through-vias 942 are not coplanar on either side. This configuration allows for the conductive through-vias 942 to be coupled to a second metallization structure 946 (e.g., redistribution layer (RDL), etc.) adjacent the die 910. In some aspects, the conductive through-vias 942 are also coupled to a first metallization structure 947 (e.g., RDL, etc.) on the first side opposite the die 910. In some aspects, the first metallization structure 947 is embedded in the mold compound 934. In some aspects, the first metallization structure 947 and the second metallization structure 946 can be used for signal routing between contacts of the die and/or between dies when configured as a bridge. In some aspects, a plurality of solder bumps 938 may be coupled to the second metallization structure 946. The plurality of solder bumps 938 may also be coupled to the plurality of conductive pillars 932 to allow for connection to another component, such as a substrate.

Figure 10:
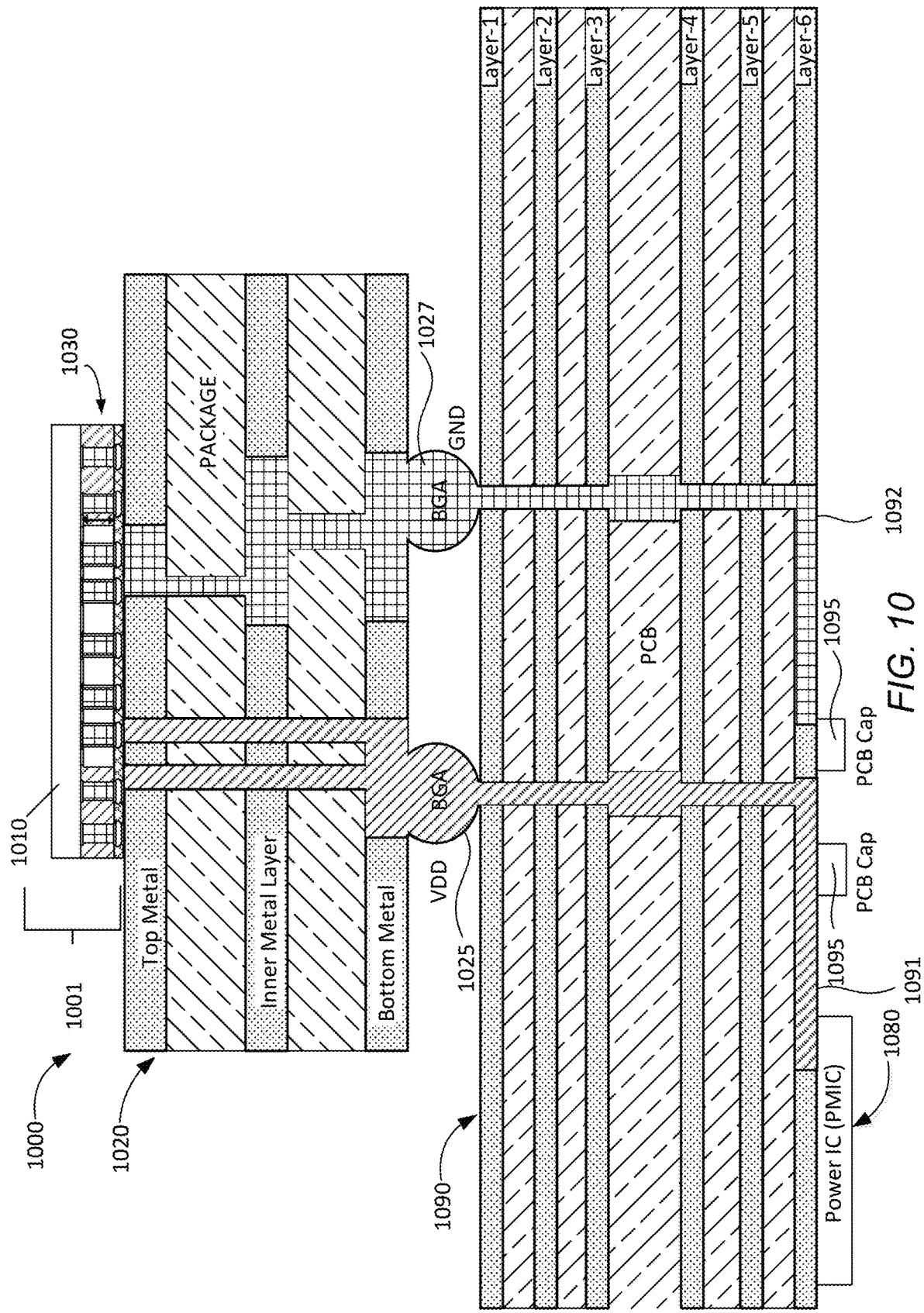
FIG. 10 illustrates components of an apparatus according to one or more aspects of the disclosure.

FIG. 10 illustrates components of an apparatus 1000 according to one or more aspects of the disclosure. Regardless of the various configurations of the semiconductor devices 1001 (e.g., die 1010 and thermally conductive interface 1030) discussed above, it will be appreciated that the package 1020 may be configured to couple the semiconductor device 1001 to a PCB 1090. In some aspects, it will be appreciated that the semiconductor device 1001 may be directly coupled to the PCB 1090. The PCB 1090 is also coupled to a power supply 1080 (e.g., a power management integrated circuit (PMIC)), which allows the package 1020 and the die 1010 to be electrically coupled to the PMIC 1080. Specifically, one or more power supply (VDD) lines 1091 and one or more ground (GND) lines 1092 may be coupled to the PMIC 1080 to distribute power to the PCB 1090, package 1020 via VDD BGA pin 1025 and GND BGA pin 1027 and to the die 1010 via thermally conductive interface 1030 (which may be one or more THBI structures, as discussed above). The VDD line 1091 and GND line 1092 each may be formed from traces, shapes, or patterns in one or more metal layers of the PCB 1090 (e.g., layers 1-6) coupled by one or more vias through insulating layers separating the metal layers 1-6 in the PCB 1090. The PCB 1090 may have one or more PCB capacitors (PCB cap) 1095 that can be used to condition the power supply signals, as is known to those skilled in the art. Additional connections and devices may be coupled to and/or pass through the PCB 1090 to the package 1020 via one or more additional BGA pins (not illustrated) on the package 1020. It will be appreciated that the illustrated configuration and descriptions are provided merely to aid in the explanation of the various aspects disclosed herein. For example, the PCB 1090 may have more or less metal and insulating layers, there may be multiple lines providing power to the various components, etc. Accordingly, the forgoing illustrative examples and associated figures should not be construed to limit the various aspects disclosed and claimed herein.

In accordance with the various aspects disclosed herein, at least one aspect includes an apparatus including: a semiconductor device (e.g., 100, 300, 500, 600, 700, 800, 900, and 1000) having a die (e.g., 110, 310, 510, etc.), a thermally conductive interface (e.g., 130, 330, 530, etc.) comprising a thermal bridge interposer (THBI) structure (e.g., 140, 340, 540, etc.) and a substrate (e.g., 150, 350, 550, etc.). The die (e.g., 110, 310, 510, etc.) is coupled to the substrate (e.g., 150, 350, 550, etc.) by the thermally conductive interface (e.g., 130, 330, 530, etc.) and at least a portion of the die (e.g., 110, 310, 510, etc.) is coupled to the substrate (e.g., 150, 350, 550, etc.) by the THBI structure (e.g., 140, 340, 540, etc.). The various aspects disclosed provide various technical advantages. For example, in at least some aspects, the feature(s) of a thermally conductive interface comprising the THBI structure provides for a parallel thermal path through the THBI structure (e.g., in addition to Cu pillars in the remaining portion of the thermally conductive interface). Additionally, the THBI structure can be inserted in the area of local hotspots, to take advantage of the increased thermal conductivity and low insertion loss of the THBI structure. Other technical advantages will be recognized from various aspects disclosed herein and these technical advantages are merely provided as examples and should not be construed to limit any of the various aspects disclosed herein.

In order to fully illustrate aspects of the design of the present disclosure, methods of fabrication are presented. Other methods of fabrication are possible and discussed fabrication methods are presented only to aid understanding of the concepts disclosed herein.

FIGS. 11A to 11J illustrate fabrication techniques in accordance with one or more aspects of the disclosure. It will be appreciated that the following fabrication process is provided merely as general illustration of some of the aspects of the disclosure and is not intended to limit the disclosure or accompanying claims. Further, many details in the fabrication process known to those skilled in the art may be omitted or combined in summary process portions to facilitate an understanding of the various aspects disclosed without a detailed rendition of each detail and/or all possible process variations.

Figure 11A:
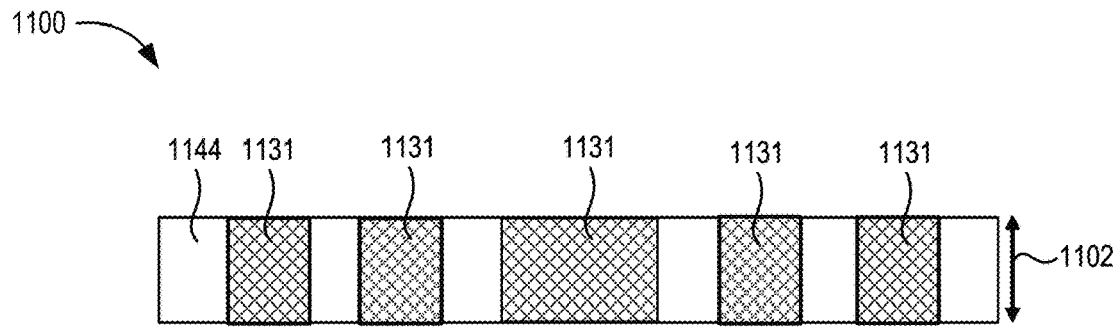
FIGS. 11A-11J illustrate portions of one or more processes for manufacturing a semiconductor device in accordance with one or more aspects of the disclosure.

FIG. 11A illustrates a portion of a fabrication process of a semiconductor device 1100, according to at least one aspect of the disclosure. A thermal bridge interposer (THBI) structure 1140 has a ceramic layer 1144 with through holes 1131 provided. The through holes 1131 may be formed by laser drilling or any suitable process. The ceramic layer 1144 may comprise one or more materials with a high thermal conductivity, such as, Alumina ceramic, which has a thermal conductivity (K) on a range of 30-40 W/mK and a thickness 1102 of 40-80 um. Further, the THBI structure 1140, in some aspects, has a low insertion loss due to very low loss tangent (e.g., 0.0001).

Figure 11B:
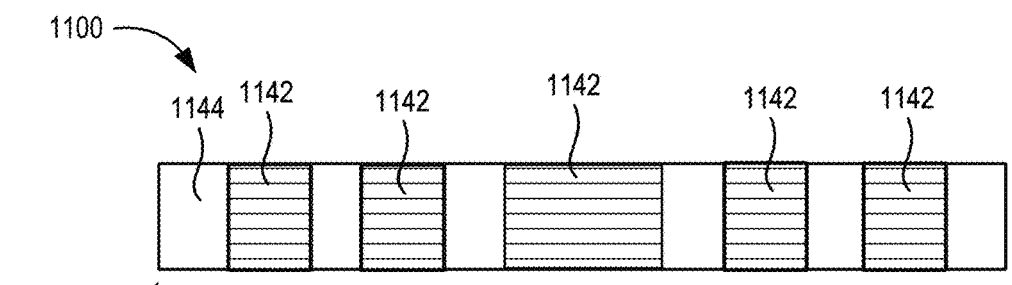

FIG. 11B illustrates an initial formation of a semiconductor device 1100 according to at least one aspect of the disclosure. The fabrication process continues with the THBI structure 1140 having the ceramic layer 1144 with through holes filled with a conductive material (e.g., Cu) and in the case of an Alumina ceramic material, may be considered as through-Alumina-vias (TAV) or more generally as a plurality of conductive through-vias 1142.

Figure 11C:
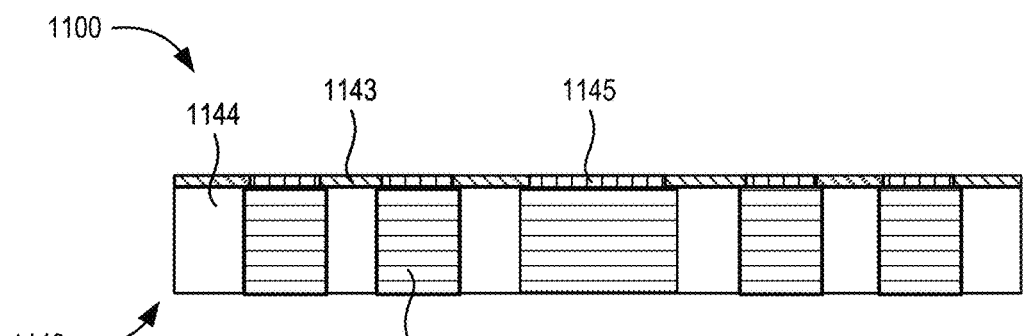

FIG. 11C illustrates a portion of a fabrication process of the semiconductor device 1100, according to at least one aspect of the disclosure. The fabrication process continues with the THBI structure 1140 having the ceramic layer 1144 having the plurality of conductive through-vias 1142 formed. In this portion of the fabrication process, a plurality of top pads 1145 is formed on the plurality of conductive through-vias 1142 and a bonding layer 1143 (e.g., passivation layer which may be formed by one or more oxide layers) may be formed over the ceramic layer 1144 and between the plurality of top pads 1145. The plurality of top pads 1145 may be formed by over-plating or any suitable technique.

Figure 11D:
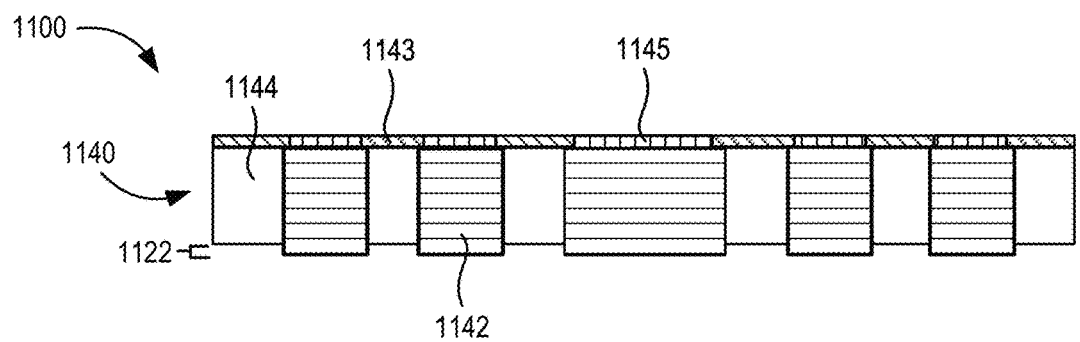

FIG. 11D illustrates a portion of a fabrication process of the semiconductor device 1100, according to at least one aspect of the disclosure. The fabrication process continues with the optional addition of protruding portions 1122 of the plurality of conductive through-vias 1142. The protruding portions 1122 of the plurality of conductive through-vias 1142 may be on the order of 20 um and may be formed by over-plating or any suitable technique.

Figure 11E:
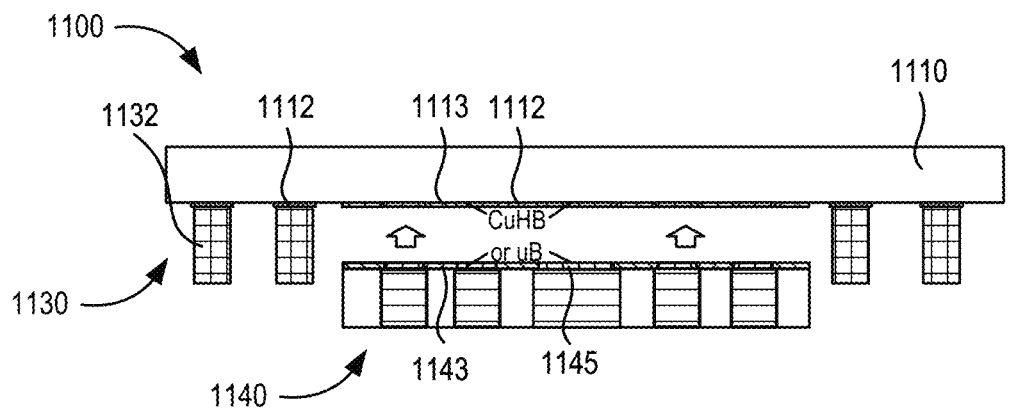

FIG. 11E illustrates a portion of a fabrication process of the semiconductor device 1100, according to at least one aspect of the disclosure. The fabrication process continues with the attachment of the THBI structure 1140 to a die 1110.

The THBI structure 1140 is directly bonded to die pads 1112, which may be embedded in a passivation layer 1113. It will be appreciated that the hybrid bond can be Cu-to-Cu and oxide-to-oxide hybrid bonding to the plurality of top pads 1145 in the bonding layer 1143. Alternatively, a micro-bond, e.g., Copper/Nickle/Silver-Tin(Cu/Ni/AgSn), can also be used for the bonding (not specifically illustrated). Additionally, a portion of a thermally conductive interface 1130 is formed with a plurality of conductive pillars 1132 being attached to the die 1110.

Figure 11F:
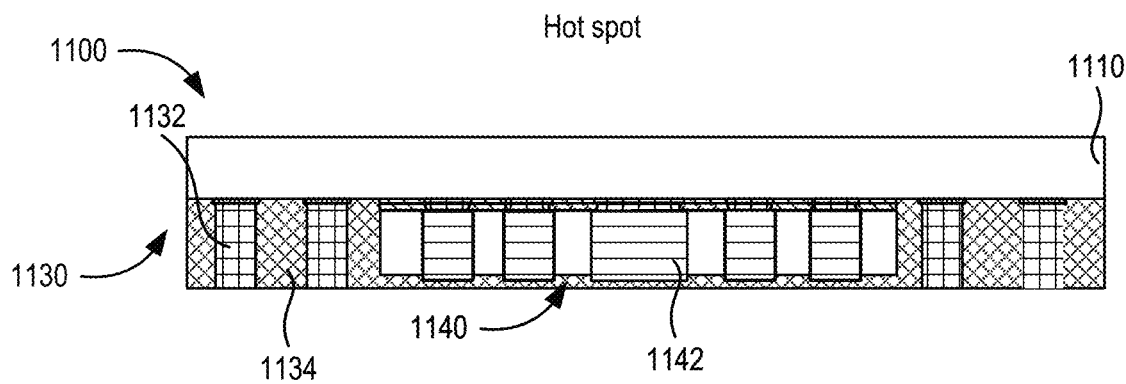

FIG. 11F illustrates a portion of a fabrication process of the semiconductor device 1100, according to at least one aspect of the disclosure. The fabrication process continues with a mold compound 1134 being deposited over the THBI structure 1140 and the plurality of conductive pillars 1132 of the thermally conductive interface 1130. It will be appreciated that at this stage the mold compound 1134 may cover the protruding portions of the plurality of conductive through-vias 1142.

Figure 11G:
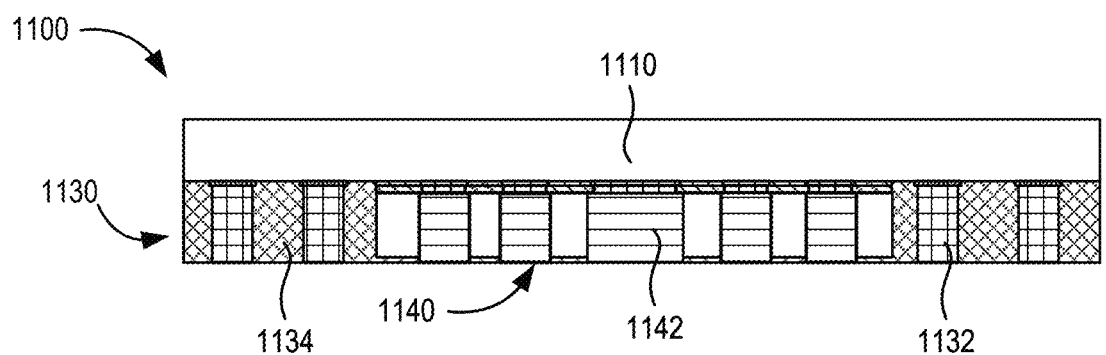

FIG. 11G illustrates a portion of a fabrication process of the semiconductor device 1100, according to at least one aspect of the disclosure. The fabrication process continues with a mold compound 1134 being ground down to expose the plurality of conductive through-vias 1142 of the THBI structure 1140. Additionally, the grinding process results in the plurality of conductive pillars 1132 and the plurality of conductive through-vias 1142 being coplanar on the bottom, which can facilitate further processing and ultimately the attachment process to the substrate (not illustrated). The configuration of the thermally conductive interface 1130 in this illustration is one optional configuration, with the molding compound disposed between the plurality of conductive through-vias 1142 in the protruding portion.

Figure 11H:
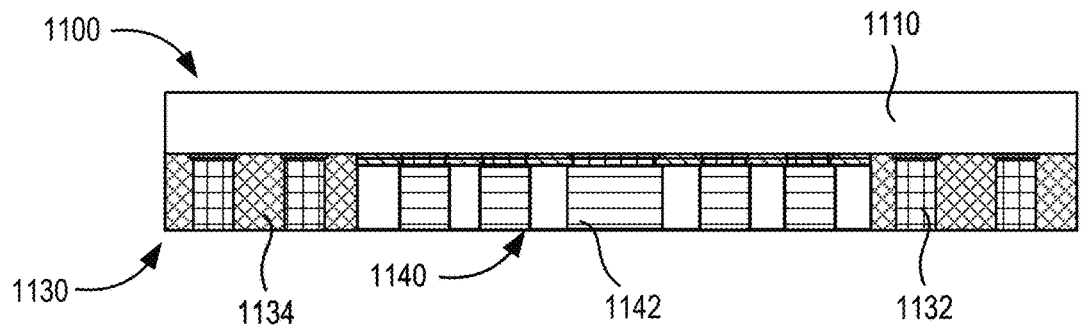

FIG. 11H illustrates a portion of a fabrication process of the semiconductor device 1100, according to at least one aspect of the disclosure. The fabrication process continues with an optional further grinding of the mold compound 1134 and the protruding portions of the plurality of conductive through-vias 1142 of the THBI structure 1140. The configuration of the thermally conductive interface 1130 in this illustration is another optional configuration, with the molding removed over the THBI structure 1140 and the protruding portions of the plurality of conductive through-vias 1142, also being ground flush. In this configuration, the grinding process also results in the plurality of conductive pillars 1132 and the plurality of conductive through-vias 1142 being coplanar on the bottom, which can facilitate further processing and ultimately the attachment process to the substrate (not illustrated). In an alternative process, the THBI structure 1140 of FIG. 11C (without the optional protruding portions of the plurality of conductive through-vias 1142) could be attached to the die 1110 and the mold compound 1134 would be ground down to expose the THBI structure 1140, resulting in substantially the same configuration as illustrated in FIG. 11H.

Figure 11I:
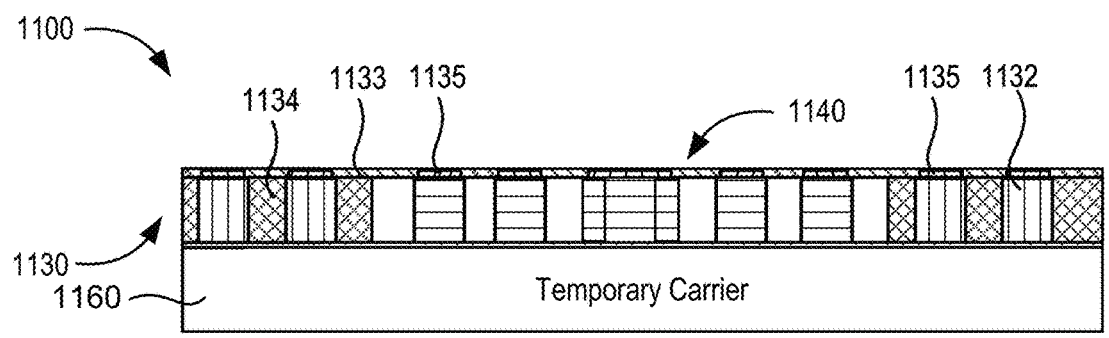

FIG. 11I illustrates a portion of a fabrication process of the semiconductor device 1100, according to at least one aspect of the disclosure. The fabrication process continues with an alternative process that continues from FIG. 11C using the THBI structure 1140 of FIG. 11C (without the optional protruding portions of the plurality of conductive through-vias 1142). The alternative process continues with the thermally conductive interface 1130 being attached to a temporary carrier 1160. The thermally conductive interface 1130 includes the THBI structure 1140 along with the plurality of conductive pillars 1132 embedded in mold compound 1134. A plurality of top pads 1135 are coupled to the plurality of conductive pillars 1132 and plurality of conductive through-vias 1142. A passivation layer 1133 is deposited over thermally conductive interface 1130, with the plurality of top pads 1135 being exposed.

Figure 11J:
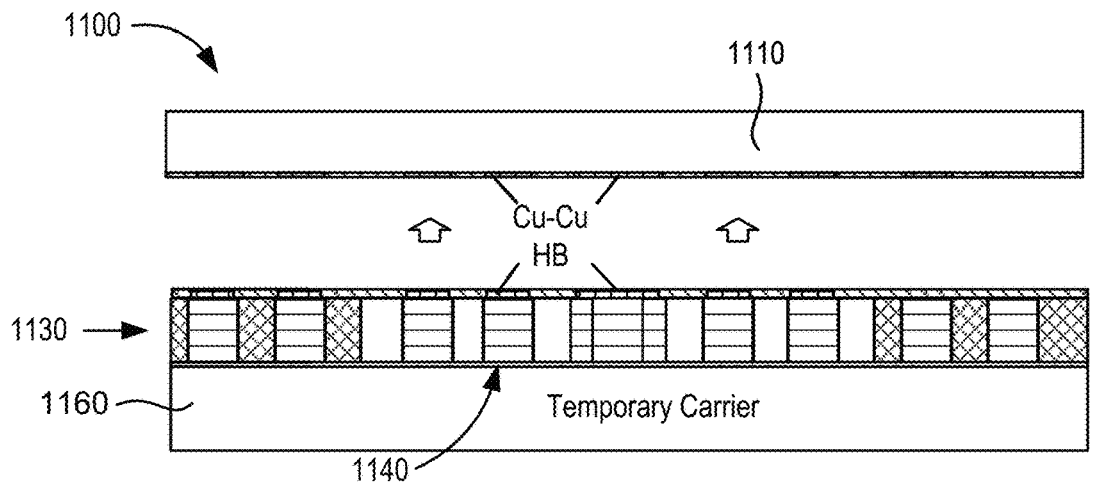

FIG. 11J illustrates a portion of a fabrication process of the semiconductor device 1100, according to at least one aspect of the disclosure. The fabrication process continues with the attachment of die 1110 to the thermally conductive interface 1130, which is still attached to a temporary carrier 1160. The attachment may be performed by the Cu-to-Cu and oxide-to-oxide hybrid bonding or any suitable technique, like Cu-to-Cu and polymer-to-polymer bonding. It will be appreciated that after the die 1110 attachment and removal of the temporary carrier 1160 the resulting semiconductor device 1100 will be substantially similar to the semiconductor device 1100 illustrated in FIG. 11H. Accordingly, the details and illustration of the removal of the temporary carrier 1160 and subsequent coupling to a substrate.

Figure 12:
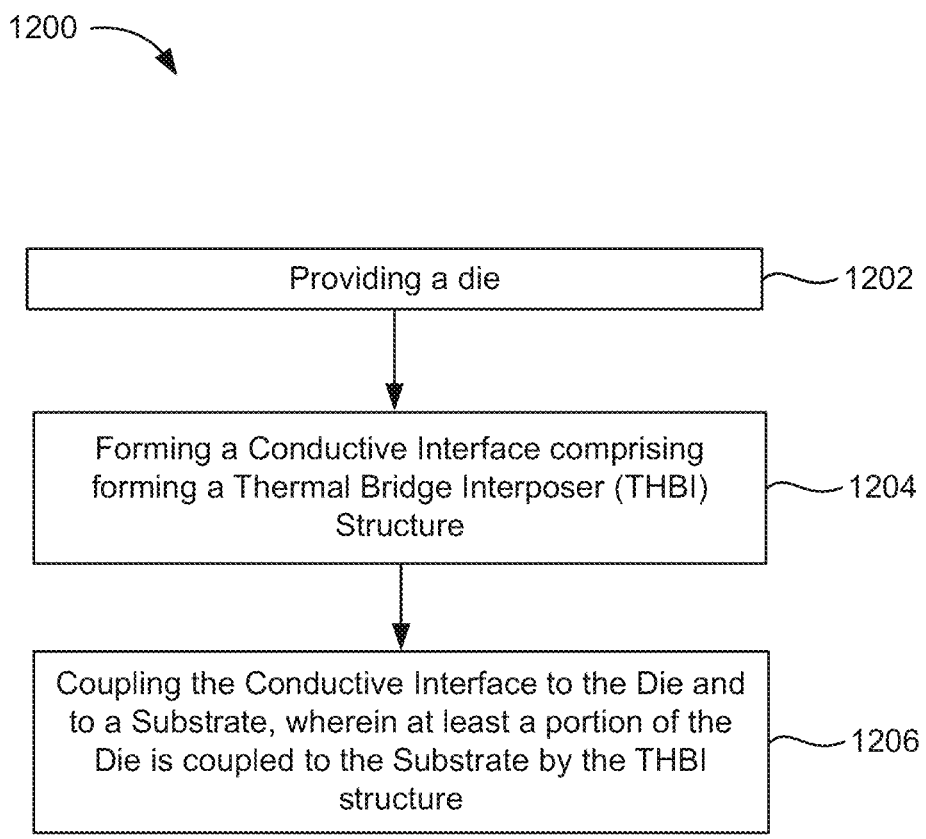
FIG. 12 illustrates a flowchart of a method for manufacturing a semiconductor device in accordance with one or more aspects of the disclosure.

It will be appreciated from the foregoing that there are various methods for fabricating semiconductor devices as disclosed herein. FIG. 12 illustrates a simplified flowchart of a method 1200 for fabricating semiconductor devices. The method may begin in block 1202 with providing a die. The method may continue in block 1204 forming a thermally conductive interface comprising forming a thermal bridge interposer (THBI) structure. The method may continue in block 1206 with coupling the thermally conductive interface to the die and to a substrate, wherein at least a portion of the die is coupled to the substrate by the THBI structure.

Accordingly, it will be appreciated from the foregoing disclosure that additional processes for fabricating the various aspects disclosed herein will be apparent to those skilled in the art and a literal rendition of the processes discussed above will not be provided or illustrated in the included drawings. It will be appreciated that the sequence of the fabrication processes is not necessarily in any order and later processes may be discussed earlier to provide an example of the breadth of the various aspects disclosed.

Figure 13:
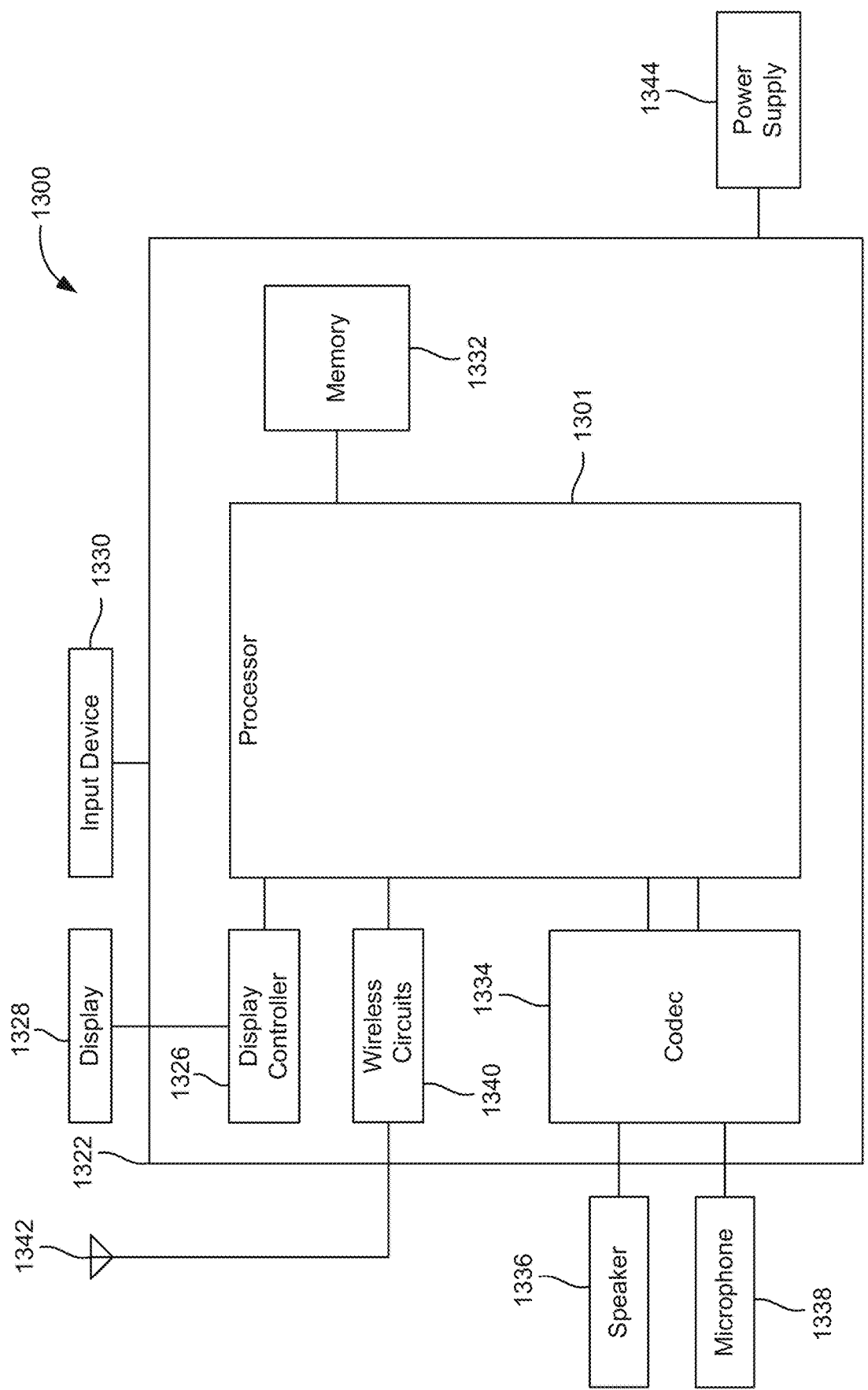
FIG. 13 illustrates an exemplary mobile device in accordance with one or more aspects of the disclosure.

FIG. 13 illustrates an exemplary mobile device in accordance with some examples of the disclosure. Referring now to FIG. 13, a block diagram of a mobile device that is configured according to exemplary aspects is depicted and generally designated mobile device 1300. In some aspects, mobile device 1300 may be configured as a wireless communication device. As shown, mobile device 1300 includes processor 1301. Processor 1301 may be communicatively coupled to memory 1332 over a link, which may be a die-to-die or chip-to-chip link. Mobile device 1300 also includes display 1328 and display controller 1326, with display controller 1326 coupled to processor 1301 and to display 1328.

In some aspects, FIG. 13 may include coder/decoder (CODEC) 1334 (e.g., an audio and/or voice CODEC) coupled to processor 1301; speaker 1336 and microphone 1338 coupled to CODEC 1334; and wireless circuits 1340 (which may include a modem, RF circuitry, filters, etc., which may be implemented using one or more THBI structures, as disclosed herein) coupled to wireless antenna 1342 and to processor 1301.

In a particular aspect, where one or more of the above-mentioned blocks are present, processor 1301, display controller 1326, memory 1332, CODEC 1334, and wireless circuits 1340 can be included in a system-in-package or system-on-chip device 1322 which may be implemented in part including the THBI structures disclosed herein. Input device 1330 (e.g., physical, or virtual keyboard), power supply 1344 (e.g., battery), display 1328, input device 1330, speaker 1336, microphone 1338, wireless antenna 1342, and power supply 1344 may be external to system-on-chip device 1322 and may be coupled to a component of system-on-chip device 1322, such as an interface or a controller.

It should be noted that although FIG. 13 depicts a mobile device 1300, processor 1301 and memory 1332 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 14:
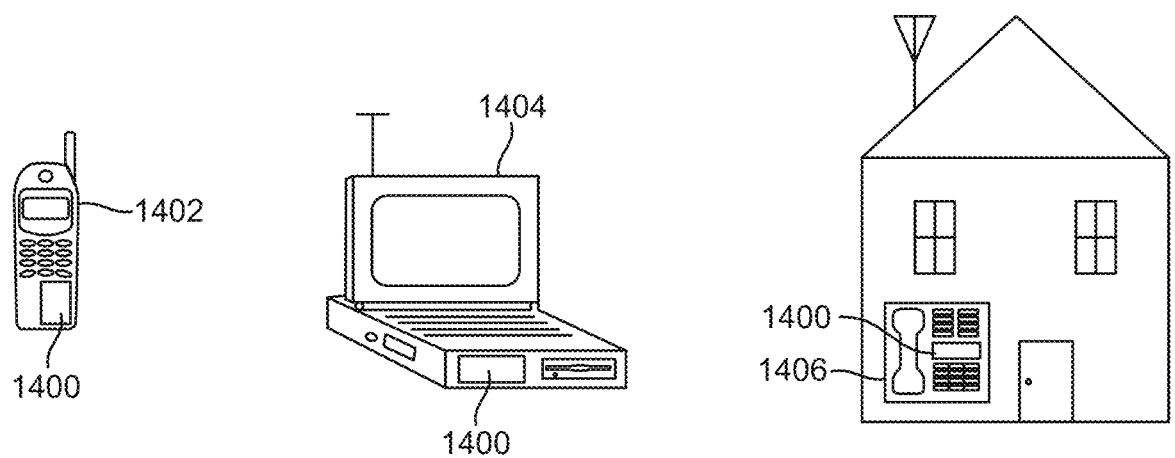
FIG. 14 illustrates various electronic devices that may be integrated with any of the aforementioned devices in accordance with one or more aspects of the disclosure.

FIG. 14 illustrates various electronic devices that may be integrated with any of the aforementioned integrated devices or semiconductor devices in accordance with various examples of the disclosure. For example, a mobile phone device 1402, a laptop computer device 1404, and a fixed location terminal device 1406 may each be considered generally user equipment (UE) and may include a semiconductor device 1400, including one or more THBI structures, as described herein. The semiconductor device 1400 may be, for example, any of the integrated circuits, dies, integrated devices, integrated device packages, integrated circuit devices, device packages, integrated circuit (IC) packages, package-on-package devices as will be appreciated from the description herein. The devices 1402, 1404, 1406 illustrated in FIG. 14 are merely exemplary. Other electronic devices may also feature the semiconductor device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, base stations, access points, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., register-transfer level (RTL), Geometric Data Stream (GDS), Gerber, and the like) stored on computer-readable media. Some or all such files may be provided to fabrication handlers who fabricate devices based on such files. Resulting products may include semiconductor wafers that are then cut into semiconductor die and packaged into semiconductor packages, integrated devices, system-on-chip devices, and the like, which may then be employed in the various apparatuses described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-14 may be rearranged and/or combined into a single component, process, feature, or function or incorporated in several components, processes, or functions. Additional elements, components, processes, and/or functions may also be added without departing from the disclosure. It should also be noted that FIGS. 1-14 and corresponding description in the present disclosure are not limited to dies and/or ICs. In some implementations, FIGS. 1-14 and the corresponding description may be used to manufacture, create, provide, and/or produce integrated devices. In some implementations, an apparatus may include one or more a die, an integrated device, a die package, an integrated circuit (IC), a device package, an integrated circuit (IC) package, a wafer, a semiconductor device, a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage, or mode of operation. Furthermore, a particular feature and/or structure can be combined with one or more other features and/or structures.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an insulator and a conductor). Furthermore, it is also intended that aspects of a clause can be included in any other independent clause, even if the clause is not directly dependent on the independent clause.

Implementation examples are described in the following numbered clauses:

Clause 1. An apparatus comprising a semiconductor device, wherein the semiconductor device comprises: a die; a thermally conductive interface comprising a thermal bridge interposer (THBI) structure; and a substrate, wherein the die is coupled to the substrate by the thermally conductive interface and at least a portion of the die is coupled to the substrate by the THBI structure.

Clause 2. The apparatus of clause 1, wherein the THBI structure comprises a ceramic layer and a plurality of conductive through-vias disposed through the ceramic layer.

Clause 3. The apparatus of clause 2, wherein the plurality of conductive through-vias comprise copper.

Clause 4. The apparatus of any of clauses 2 to 3, wherein the ceramic layer comprises an Alumina ceramic.

Clause 5. The apparatus of any of clauses 2 to 4, wherein the ceramic layer comprises a material with a thermal conductivity on a range of 30-40 watts per meter Kelvin (W/mK).

Clause 6. The apparatus of any of clauses 2 to 5, wherein the thermally conductive interface further comprises a plurality of conductive pillars embedded in a mold compound.

Clause 7. The apparatus of clause 6, wherein the plurality of conductive pillars and the plurality of conductive through-vias are coplanar on a first side of the thermally conductive interface adjacent the substrate.

Clause 8. The apparatus of clause 7, wherein the plurality of conductive pillars extends beyond the plurality of conductive through-vias on a second side of the thermally conductive interface adjacent the die.

Clause 9. The apparatus of any of clauses 7 to 8, wherein a portion of the plurality of conductive through-vias extend past the ceramic layer on the first side of the thermally conductive interface.

Clause 10. The apparatus of clause 9, wherein the portion of the plurality of conductive through-vias is embedded in the mold compound.

Clause 11. The apparatus of any of clauses 7 to 10, wherein the plurality of conductive pillars and the plurality of conductive through-vias are coplanar on a second side of the thermally conductive interface adjacent the die.

Clause 12. The apparatus of clause 11, wherein the plurality of conductive pillars and the plurality of conductive through-vias are coplanar and are coupled to the die on the second side by a hybrid bond.

Clause 13. The apparatus of any of clauses 7 to 12, wherein the thermally conductive interface further comprises: a plurality of pads coupled to the plurality of conductive pillars and the plurality of conductive through-vias on the first side; and a plurality of solder bumps coupled to the plurality of pads; wherein the plurality of pads and the plurality of solder bumps couple the plurality of conductive pillars and the plurality of conductive through-vias to the substrate.

Clause 14. The apparatus of clause 13, wherein the plurality of pads has a same pitch and a same size.

Clause 15. The apparatus of any of clauses 13 to 14, wherein the thermally conductive interface further comprises: a second mold compound, wherein the plurality of solder bumps and the plurality of pads are embedded in the second mold compound.

Clause 16. The apparatus of any of clauses 2 to 15, wherein the THBI structure further comprises: a bonding layer configured to thermally couple the THBI structure to the die.

Clause 17. The apparatus of clause 16, wherein the THBI structure further comprises: a plurality of top pads coupled to the plurality of conductive through-vias, wherein the plurality of top pads is embedded in the bonding layer.

Clause 18. The apparatus of any of clauses 2 to 17, wherein the THBI structure comprises at least one metallization structure coupled to the plurality of conductive through-vias disposed through the ceramic layer.

Clause 19. The apparatus of any of clauses 1 to 18, further comprising: a second die, wherein the second die is coupled to the die by the THBI structure, and wherein the second die is coupled to the substrate by the thermally conductive interface and at least a portion of the second die is coupled to the substrate by the THBI structure.

Clause 20. The apparatus of any of clauses 1 to 19, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, an access point, a base station, and a device in an automotive vehicle.

Clause 21. A method for fabricating a semiconductor device, the method comprising: providing a die; forming a thermally conductive interface comprising forming a thermal bridge interposer (THBI) structure; and coupling the thermally conductive interface to the die and to a substrate, wherein at least a portion of the die is coupled to the substrate by the THBI structure.

Clause 22. The method of clause 21, wherein the THBI structure comprises a ceramic layer and a plurality of conductive through-vias disposed through the ceramic layer.

Clause 23. The method of clause 22, wherein the ceramic layer comprises an Alumina ceramic.

Clause 24. The method of any of clauses 22 to 23, wherein the ceramic layer comprises a material with a thermal conductivity on a range of 30-40 watts per meter Kelvin (W/mK).

Clause 25. The method of any of clauses 22 to 24, wherein the thermally conductive interface further comprises a plurality of conductive pillars embedded in a mold compound.

Clause 26. The method of clause 25, wherein the plurality of conductive pillars and the plurality of conductive through-vias are coplanar and are coupled to the die by a hybrid bond on a second side of the thermally conductive interface adjacent the die.

Clause 27. The method of any of clauses 25 to 26, further comprising: coupling a plurality of pads to the plurality of conductive pillars and the plurality of conductive through-vias on a first side of the thermally conductive interface adjacent the substrate; and coupling a plurality of solder bumps to the plurality of pads; wherein the plurality of pads and the plurality of solder bumps couple the plurality of conductive pillars and the plurality of conductive through-vias to the substrate.

Clause 28. The method of any of clauses 22 to 27, wherein forming the THBI structure further comprises: forming a bonding layer configured to thermally couple the THBI structure to the die.

Clause 29. The method of clause 28, wherein forming the THBI structure further comprises: coupling a plurality of top pads to the plurality of conductive through-vias, wherein the plurality of top pads is embedded in the bonding layer.

Clause 30. The method of any of clauses 21 to 29, further comprising: coupling a second die to the die by the THBI structure; and coupling the second die to the substrate by the thermally conductive interface and at least a portion of the second die by the THBI structure.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising a semiconductor device, wherein the apparatus comprises:
    a die;
    a thermally conductive interface comprising a thermal bridge interposer (THBI) structure, wherein the THBI structure comprises a ceramic layer and a plurality of conductive through-vias disposed through the ceramic layer; and
    a substrate, wherein the die is coupled to the substrate by the thermally conductive interface and at least a portion of the die is coupled to the substrate by the THBI structure.

2. The apparatus of claim 1, wherein the plurality of conductive through-vias comprise copper.

3. The apparatus of claim 1, wherein the ceramic layer comprises an Alumina ceramic.

4. The apparatus of claim 1, wherein the ceramic layer comprises a material with a thermal conductivity on a range of 30-40 watts per meter Kelvin (W/mK).

5. The apparatus of claim 1, wherein the thermally conductive interface further comprises a plurality of conductive pillars embedded in a mold compound.

6. The apparatus of claim 5, wherein the plurality of conductive pillars and the plurality of conductive through-vias are coplanar on a first side of the thermally conductive interface adjacent the substrate.

7. The apparatus of claim 6, wherein the plurality of conductive pillars extends beyond the plurality of conductive through-vias on a second side of the thermally conductive interface adjacent the die.

8. The apparatus of claim 6, wherein a portion of the plurality of conductive through-vias extend past the ceramic layer on the first side of the thermally conductive interface.

9. The apparatus of claim 8, wherein the portion of the plurality of conductive through-vias is embedded in the mold compound.

10. The apparatus of claim 6, wherein the plurality of conductive pillars and the plurality of conductive through-vias are coplanar on a second side of the thermally conductive interface adjacent the die.

11. The apparatus of claim 10, wherein the plurality of conductive pillars and the plurality of conductive through-vias are coplanar and are coupled to the die on the second side by a hybrid bond.

12. The apparatus of claim 6, wherein the thermally conductive interface further comprises:
    a plurality of pads coupled to the plurality of conductive pillars and the plurality of conductive through-vias on the first side; and
    a plurality of solder bumps coupled to the plurality of pads;
    wherein the plurality of pads and the plurality of solder bumps couple the plurality of conductive pillars and the plurality of conductive through-vias to the substrate.

13. The apparatus of claim 12, wherein the plurality of pads has a same pitch and a same size.

14. The apparatus of claim 12, wherein the thermally conductive interface further comprises:
    a second mold compound, wherein the plurality of solder bumps and the plurality of pads are embedded in the second mold compound.

15. The apparatus of claim 1, wherein the THBI structure further comprises:
    a bonding layer configured to thermally couple the THBI structure to the die.

16. The apparatus of claim 15, wherein the THBI structure further comprises:
    a plurality of top pads coupled to the plurality of conductive through-vias, wherein the plurality of top pads is embedded in the bonding layer.

17. The apparatus of claim 1, wherein the THBI structure comprises at least one metallization structure coupled to the plurality of conductive through-vias disposed through the ceramic layer.

18. The apparatus of claim 1, further comprising:
    a second die, wherein the second die is coupled to the die by the THBI structure, and wherein the second die is coupled to the substrate by the thermally conductive interface and at least a portion of the second die is coupled to the substrate by the THBI structure.

19. The apparatus of claim 1, wherein the apparatus is selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IOT) device, a laptop computer, a server, an access point, a base station, and a device in an automotive vehicle.

20. A method for fabricating a structure with a semiconductor device, the method comprising:
    providing a die;
    forming a thermally conductive interface comprising forming a thermal bridge interposer (THBI) structure, wherein the THBI structure comprises a ceramic layer and a plurality of conductive through-vias disposed through the ceramic layer; and coupling the thermally conductive interface to the die and to a substrate, wherein at least a portion of the die is coupled to the substrate by the THBI structure.

21. The method of claim 20, wherein the ceramic layer comprises an Alumina ceramic.

22. The method of claim 20, wherein the ceramic layer comprises a material with a thermal conductivity on a range of 30-40 watts per meter Kelvin (W/mK).

23. The method of claim 20, wherein the thermally conductive interface further comprises a plurality of conductive pillars embedded in a mold compound.

24. The method of claim 23, wherein the plurality of conductive pillars and the plurality of conductive through-vias are coplanar and are coupled to the die by a hybrid bond on a second side of the thermally conductive interface adjacent the die.

25. The method of claim 23, further comprising:

coupling a plurality of pads to the plurality of conductive pillars and the plurality of conductive through-vias on a first side of the thermally conductive interface adjacent the substrate; and coupling a plurality of solder bumps to the plurality of pads;

wherein the plurality of pads and the plurality of solder bumps couple the plurality of conductive pillars and the plurality of conductive through-vias to the substrate.

26. The method of claim 20, wherein forming the THBI structure further comprises:

forming a bonding layer configured to thermally couple the THBI structure to the die.

27. The method of claim 26, wherein forming the THBI structure further comprises:

coupling a plurality of top pads to the plurality of conductive through-vias, wherein the plurality of top pads is embedded in the bonding layer.

28. The method of claim 20, further comprising:

coupling a second die to the die by the THBI structure; and coupling the second die to the substrate by the thermally conductive interface and at least a portion of the second die by the THBI structure.

* * * * *